US006437351B1

(12) United States Patent
Smick et al.

(10) Patent No.: US 6,437,351 B1
(45) Date of Patent: Aug. 20, 2002

(54) METHOD AND APPARATUS FOR CONTROLLING A WORKPIECE IN A VACUUM CHAMBER

(75) Inventors: Theodore H. Smick, Essex; Geoffrey Ryding, Manchester; Marvin Farley, Ipswich, all of MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/684,993

(22) Filed: Oct. 10, 2000

Related U.S. Application Data

(62) Division of application No. 09/272,981, filed on Mar. 19, 1999, now Pat. No. 6,163,033, which is a continuation of application No. 08/926,650, filed on Sep. 10, 1997, now Pat. No. 5,898,179.

(51) Int. Cl.$^7$ .................................................. H01J 37/00
(52) U.S. Cl. .............. 250/492.21; 250/398; 250/442.11
(58) Field of Search ............................ 250/492.21, 398, 250/442.11, 441.11

(56) References Cited

U.S. PATENT DOCUMENTS

| | | |
|---|---|---|
| 3,778,626 A | 12/1973 | Robertson |
| 4,035,655 A | 7/1977 | Guernet et al. |
| 4,191,385 A | 3/1980 | Fox et al. |
| 4,228,358 A | 10/1980 | Ryding |
| 4,229,655 A | 10/1980 | Ryding |
| 4,234,797 A | 11/1980 | Ryding |
| 4,258,266 A | 3/1981 | Robinson et al. |
| 4,261,762 A | 4/1981 | King |
| 4,274,004 A | 6/1981 | Kanai |
| 4,276,477 A | 6/1981 | Enge |
| 4,383,178 A | 5/1983 | Shibata et al. |
| 4,453,080 A | 6/1984 | Berkowitz |
| 4,498,833 A | 2/1985 | Hertel |
| 4,634,331 A | 1/1987 | Hertel |
| 4,672,210 A | 6/1987 | Armstrong et al. |
| 4,726,689 A | 2/1988 | Pollock |
| 4,733,091 A | 3/1988 | Robinson et al. |
| 4,745,287 A | 5/1988 | Turner |
| 4,899,059 A | 2/1990 | Freytsis et al. |
| 4,922,106 A | 5/1990 | Berrian et al. |
| 4,980,562 A | 12/1990 | Berrian et al. |
| 5,003,183 A | 3/1991 | Nogami et al. .......... 250/492.2 |
| 5,229,615 A | 7/1993 | Brune et al. ............. 250/492.2 |
| 5,486,702 A * | 1/1996 | O'Connor et al. ..... 250/492.21 |
| 5,593,551 A | 1/1997 | Lai |
| 5,594,252 A | 1/1997 | Day et al. |
| 5,600,136 A | 2/1997 | Hablanian et al. |
| 5,608,216 A | 3/1997 | Wells et al. |
| 5,608,223 A | 3/1997 | Hirokawa et al. |
| 5,624,536 A | 4/1997 | Wada et al. |
| 5,635,036 A | 6/1997 | Demaray et al. |
| 6,207,959 B1 * | 3/2001 | Satoh et al. ........... 250/492.21 |

FOREIGN PATENT DOCUMENTS

EP          0457321 A2    11/1991

* cited by examiner

*Primary Examiner*—Kiet T. Nguyen
(74) *Attorney, Agent, or Firm*—Boult Wade Tennant

(57) ABSTRACT

An apparatus used to control a workpiece inside a vacuum chamber. The workpiece is supported on a workpiece holder in the vacuum chamber. The workpiece is isolated from the atmosphere outside of the vacuum chamber by differentially pumped vacuum seals and an integral air bearing support. The differentially pumped vacuum seals and integral air bearing support allow for multiple independent motions to be transmitted to the workpiece supported by the workpiece holder. The workpiece holder motions provided are (1) rotation about the X axis, (2) translation back and forth along the Y direction of an X-Y plane on the surface of the workpiece holder, and (3) rotation of the workpiece in the X-Y plane about its Z axis. Concentric seals, oval for the translation motion and circular for the rotational motion, are differentially pumped through common ports to provide successively decreasing pressure and gas flow in order to reduce the gas load into the vacuum vessel to a negligible rate.

7 Claims, 11 Drawing Sheets

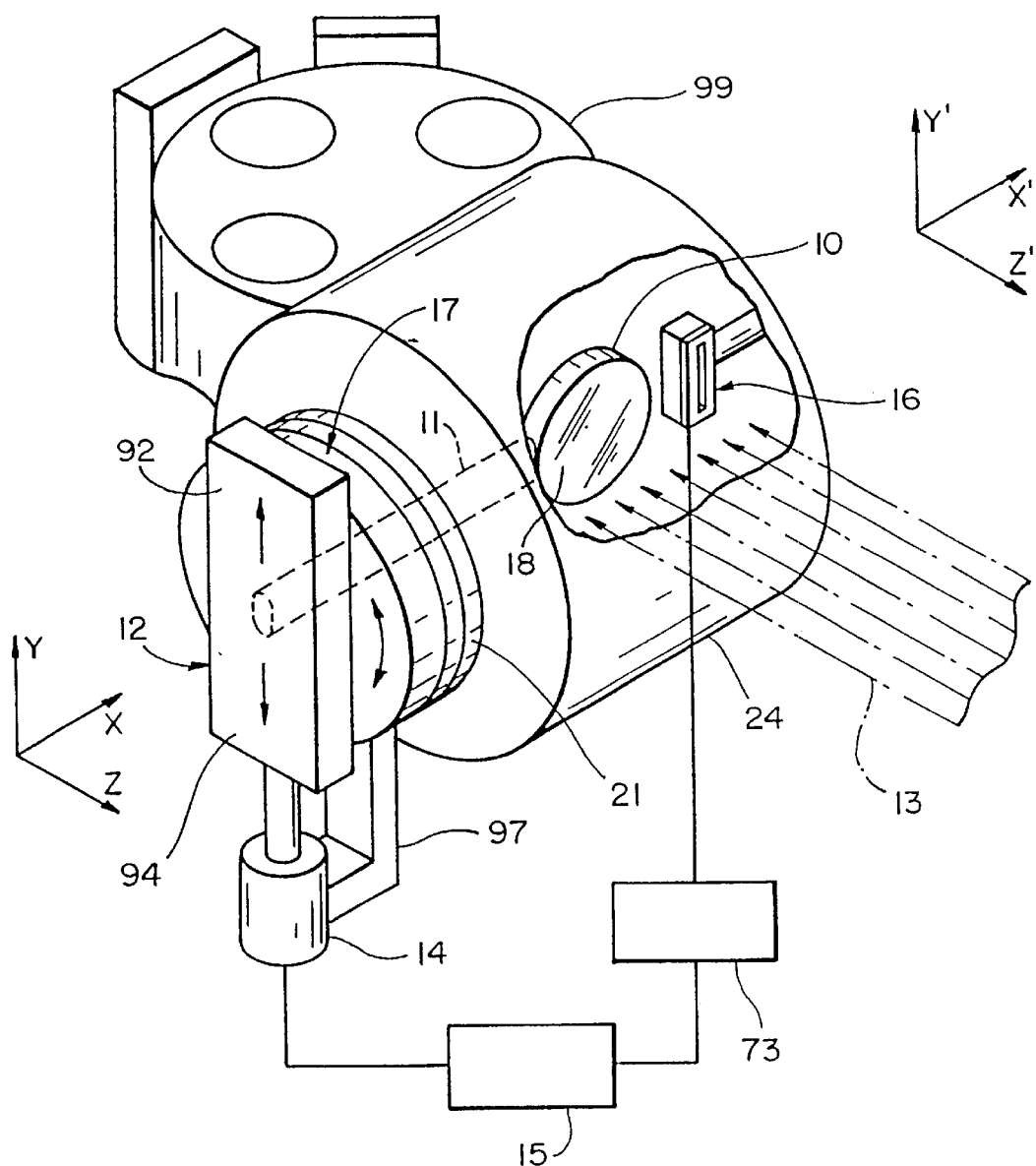
FIG_1

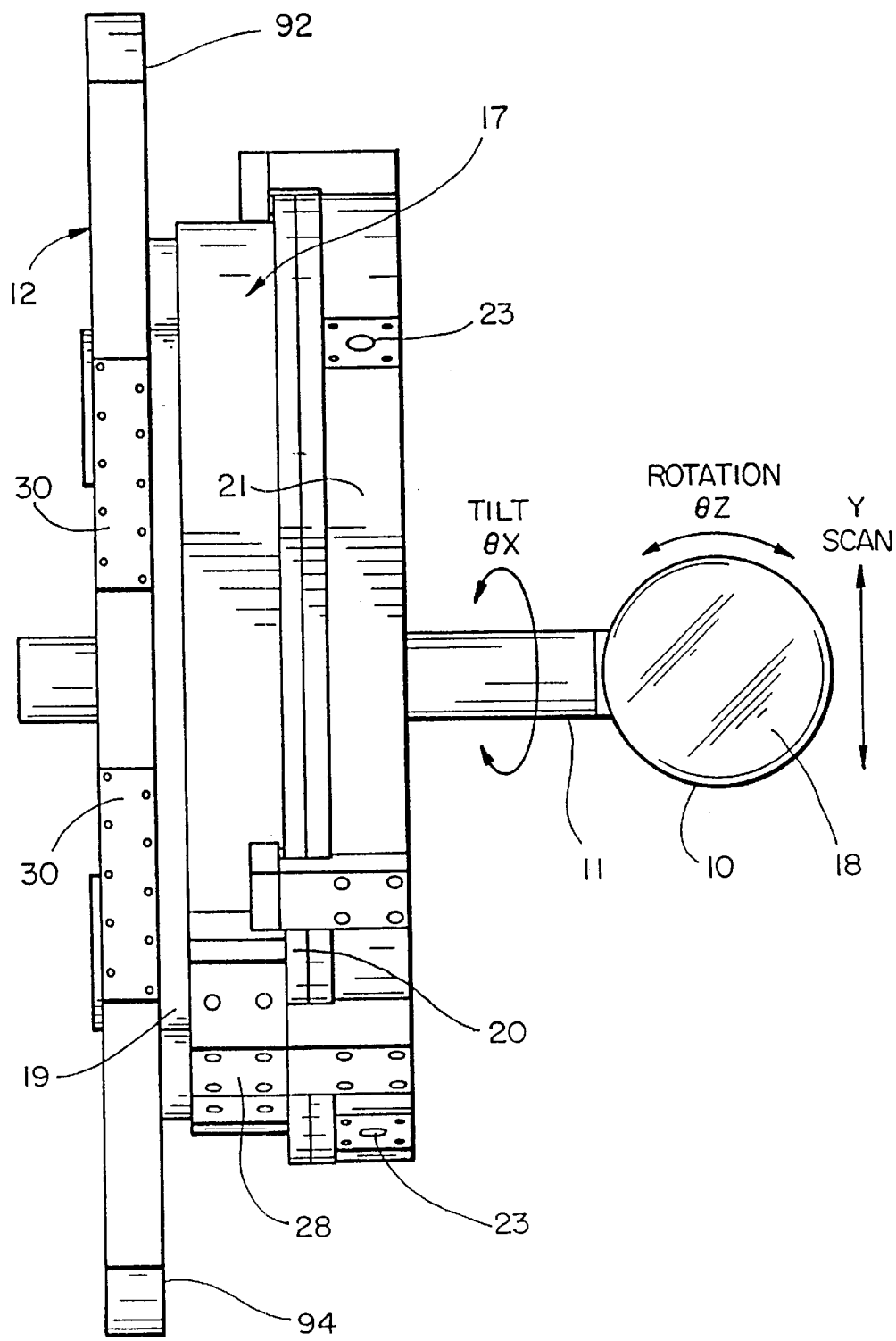
FIG_2A

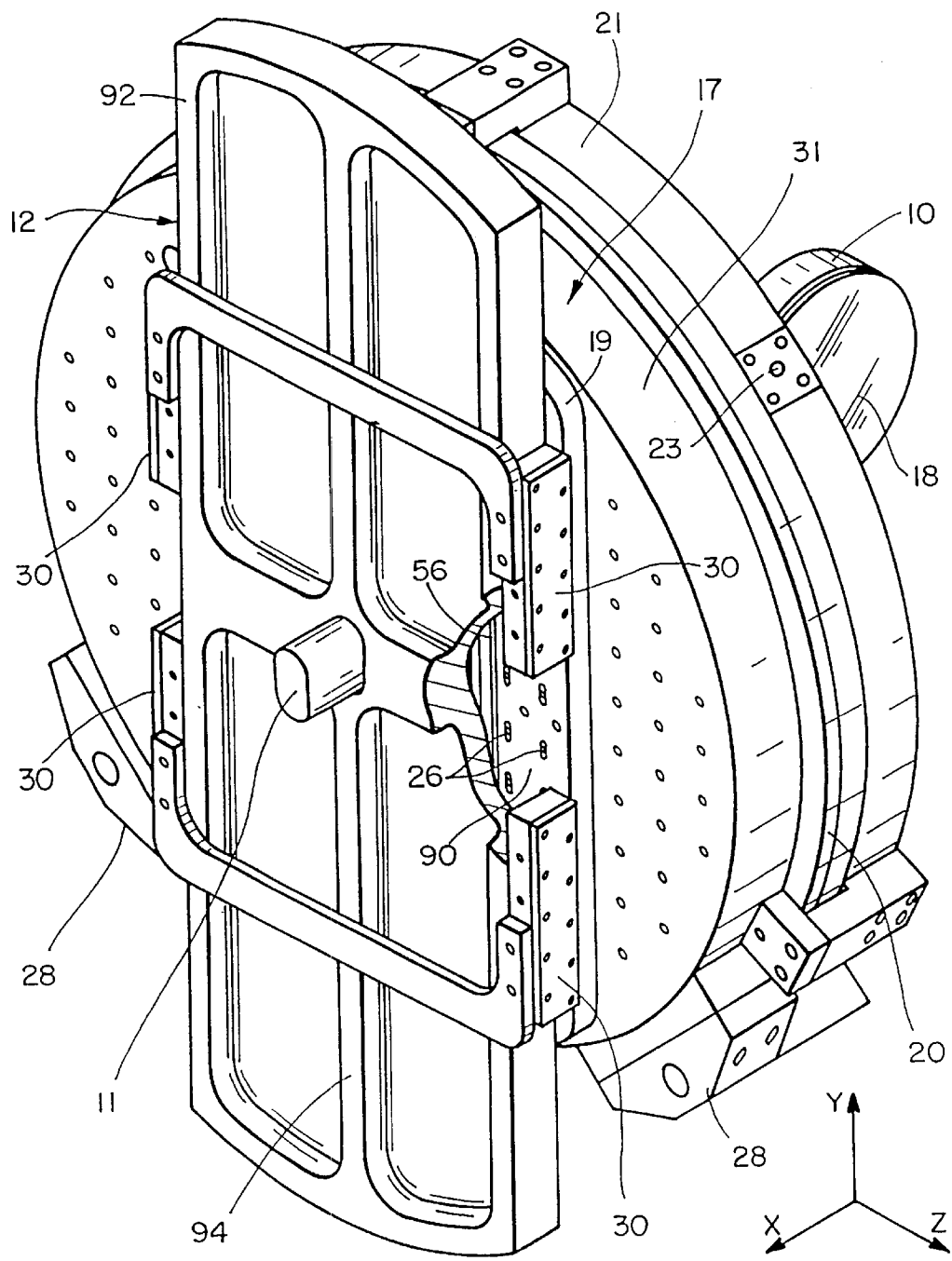
FIG_2B

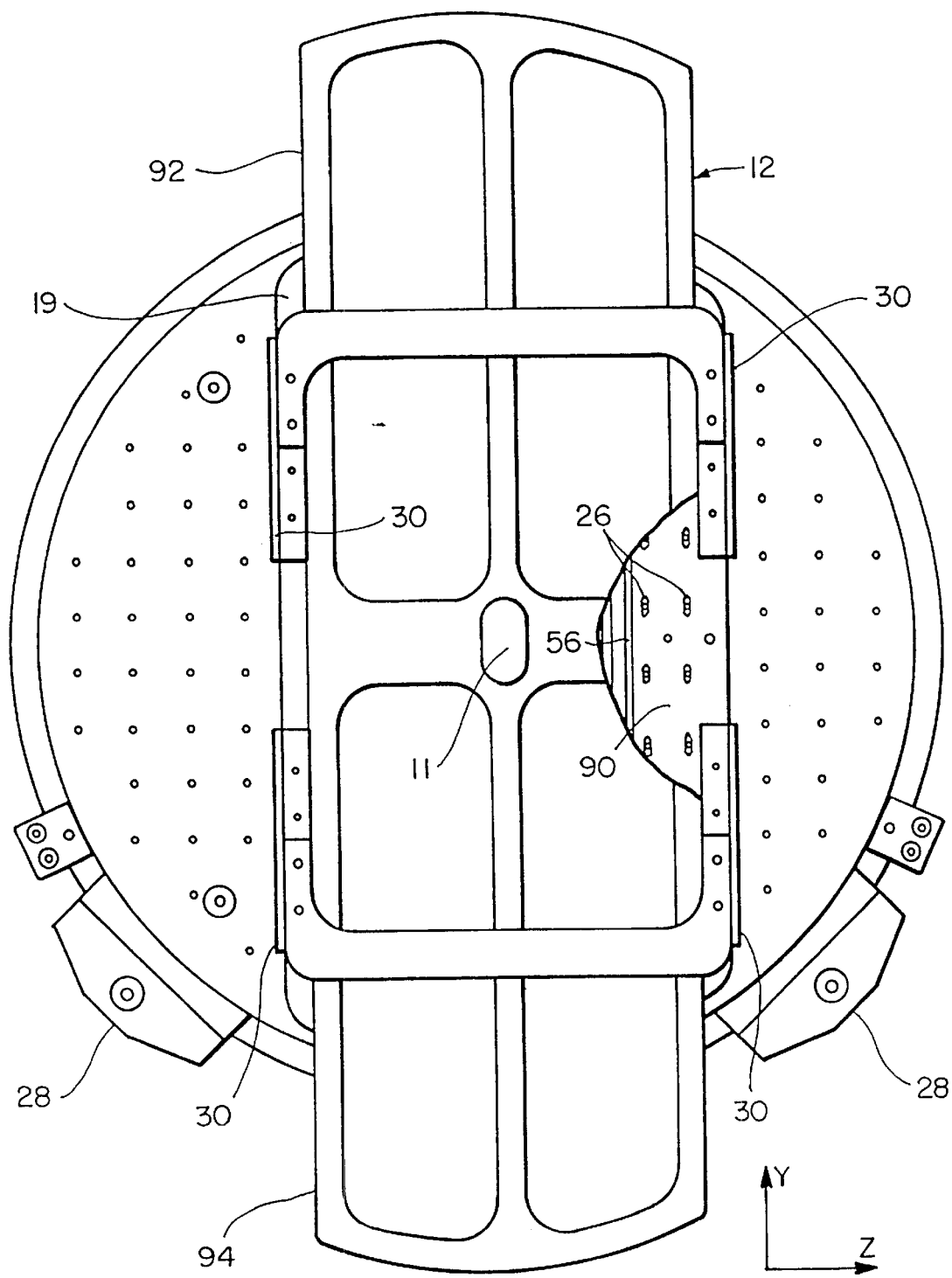
FIG_2C

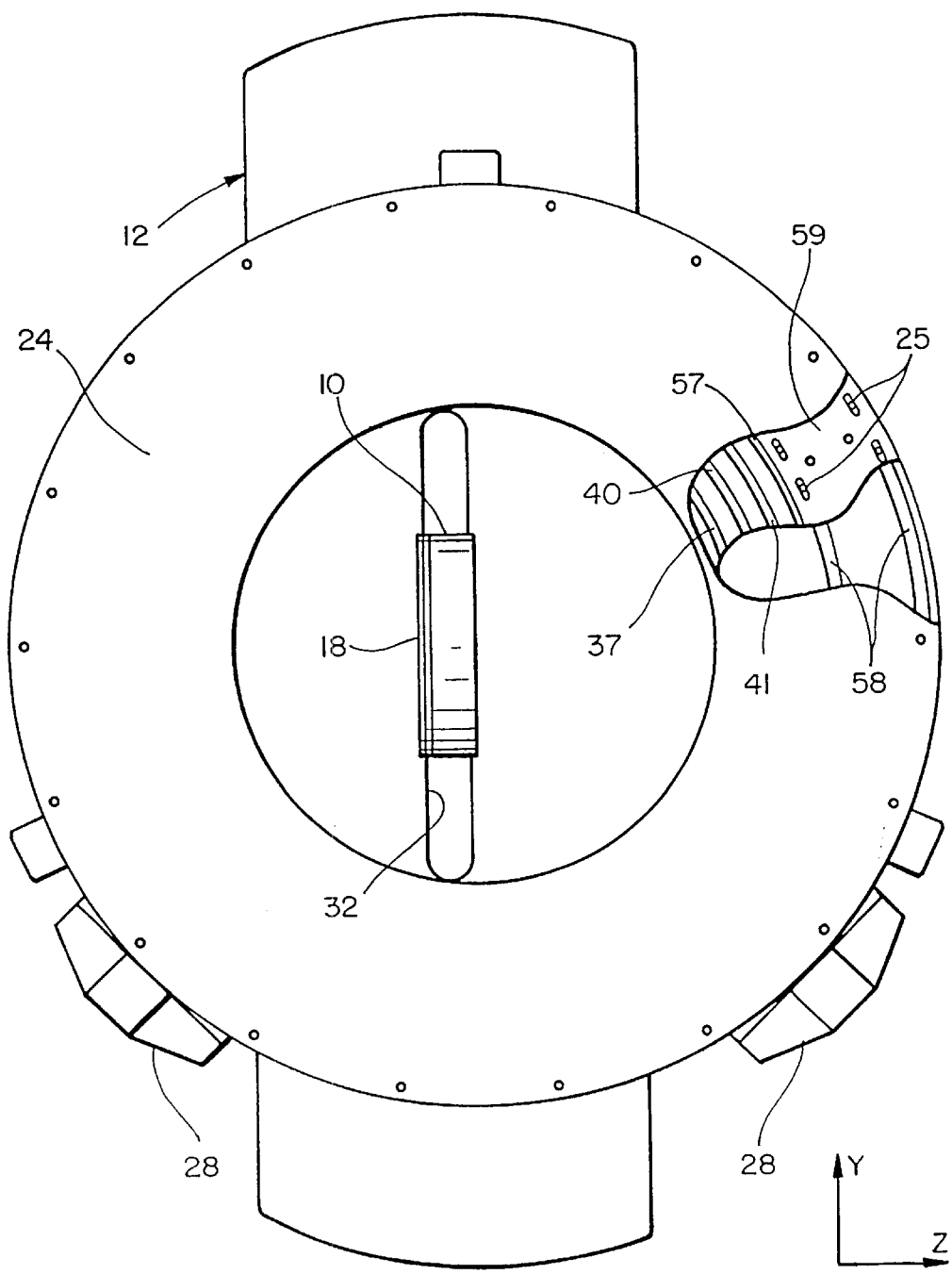
FIG_2D

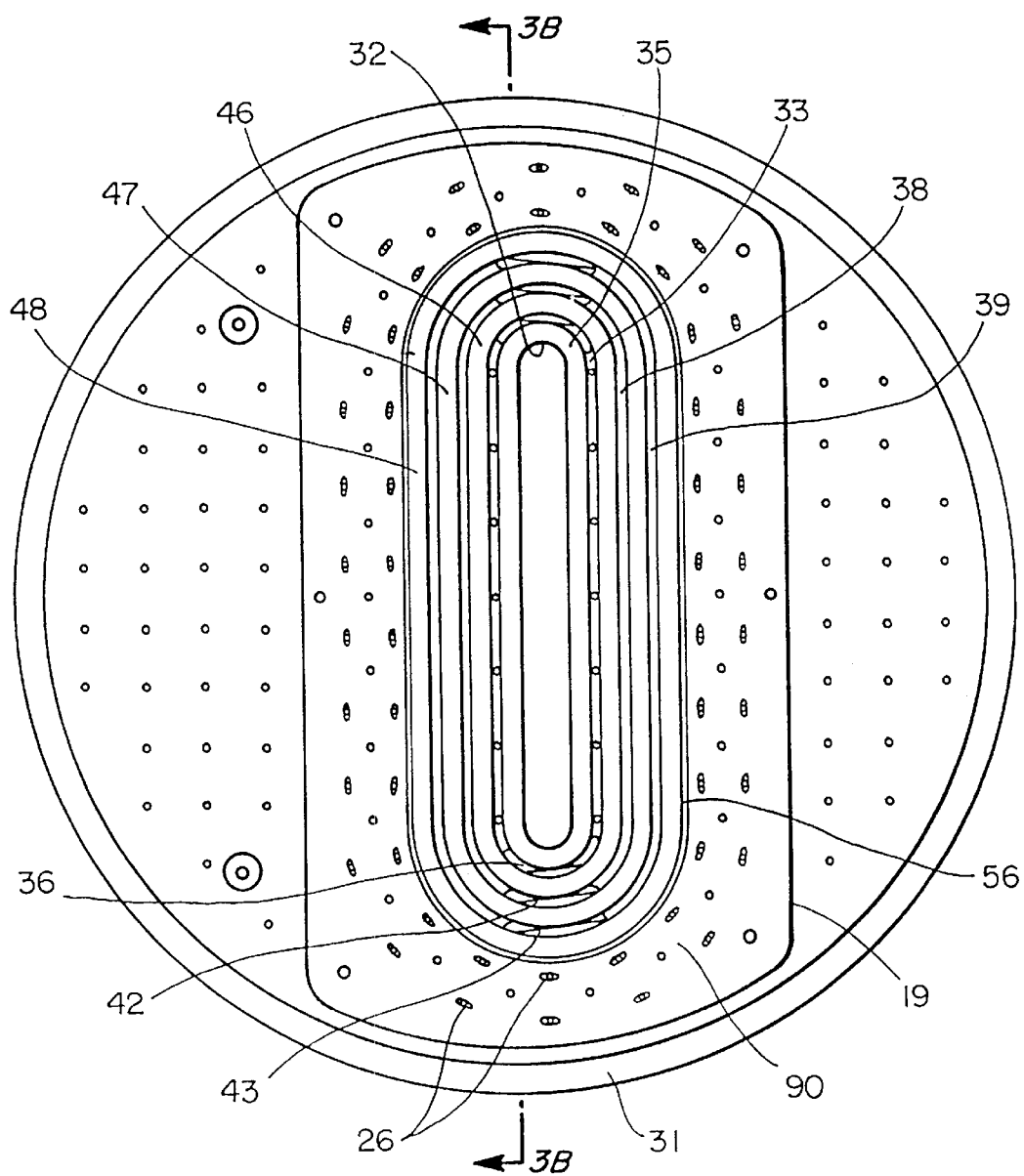
FIG_3A

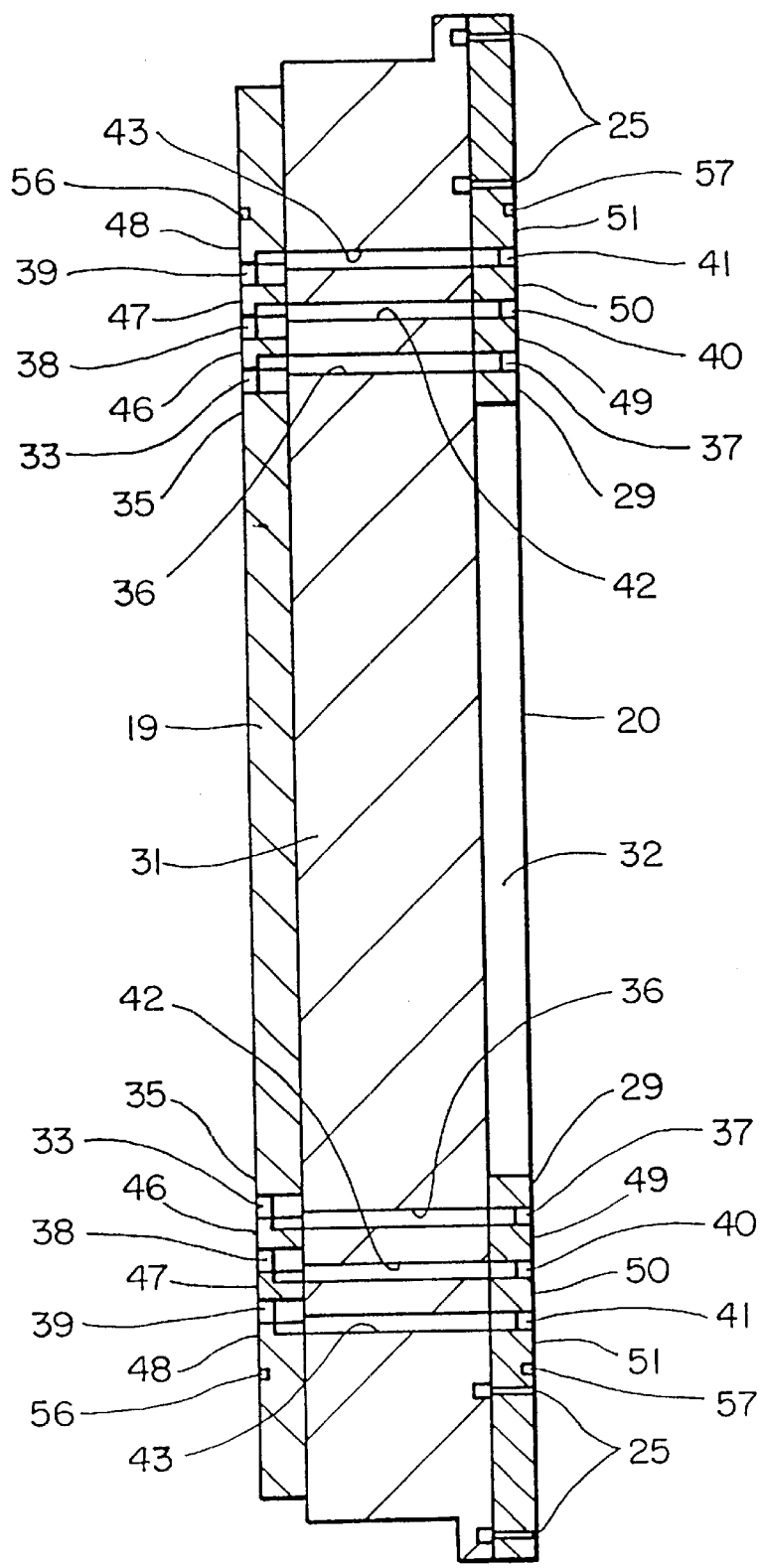
FIG_3B

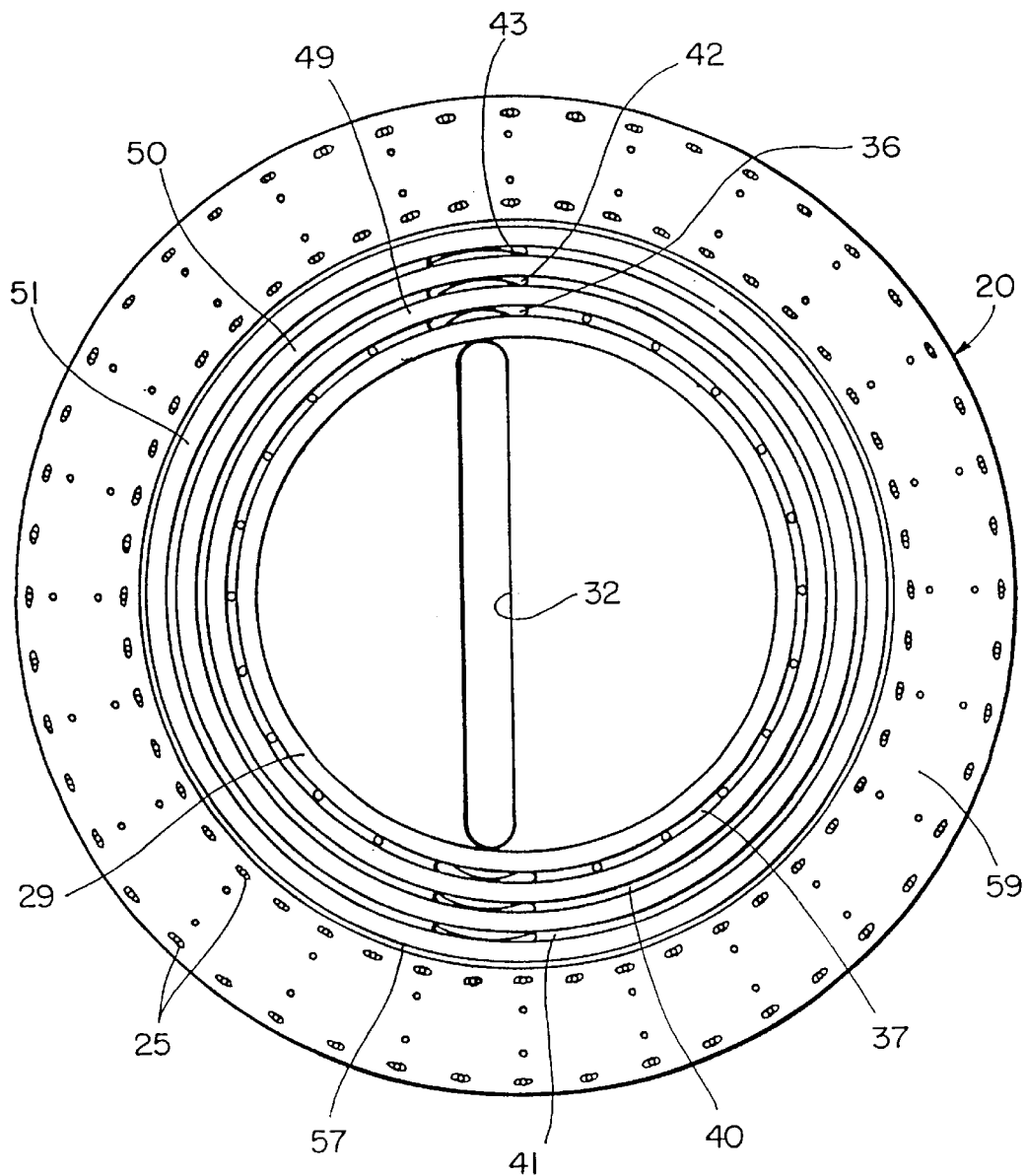
FIG_3C

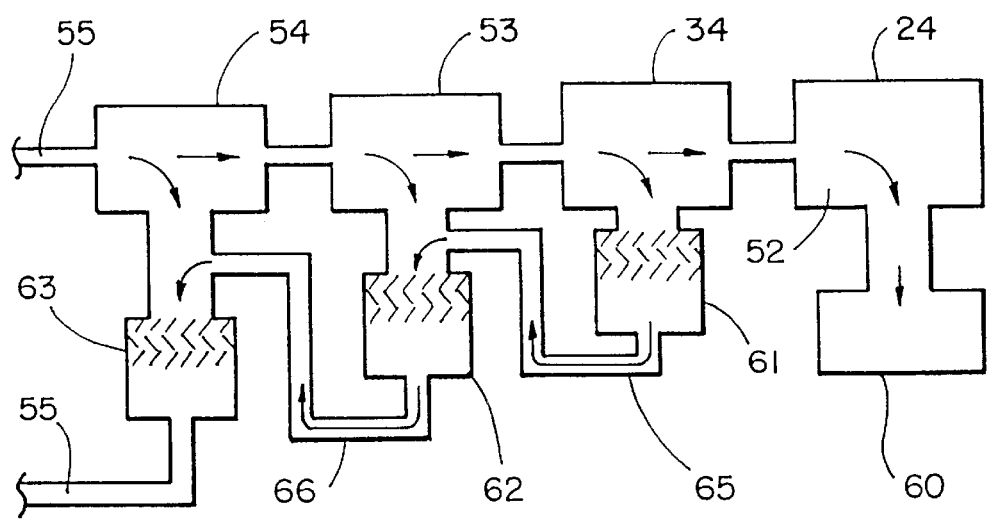
FIG_4
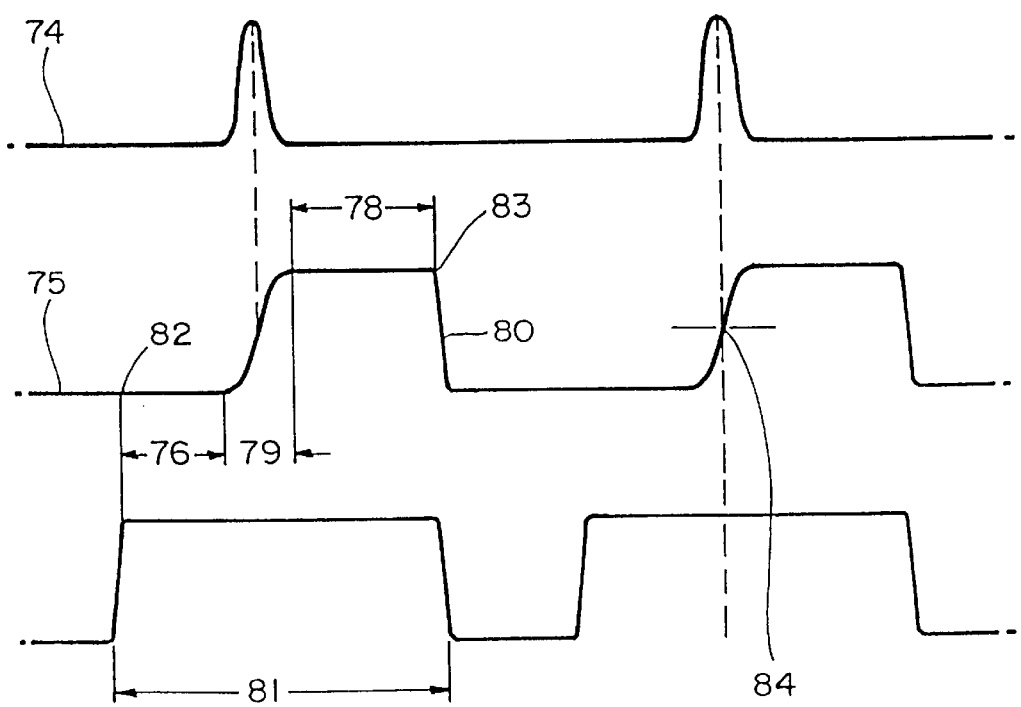
FIG_6

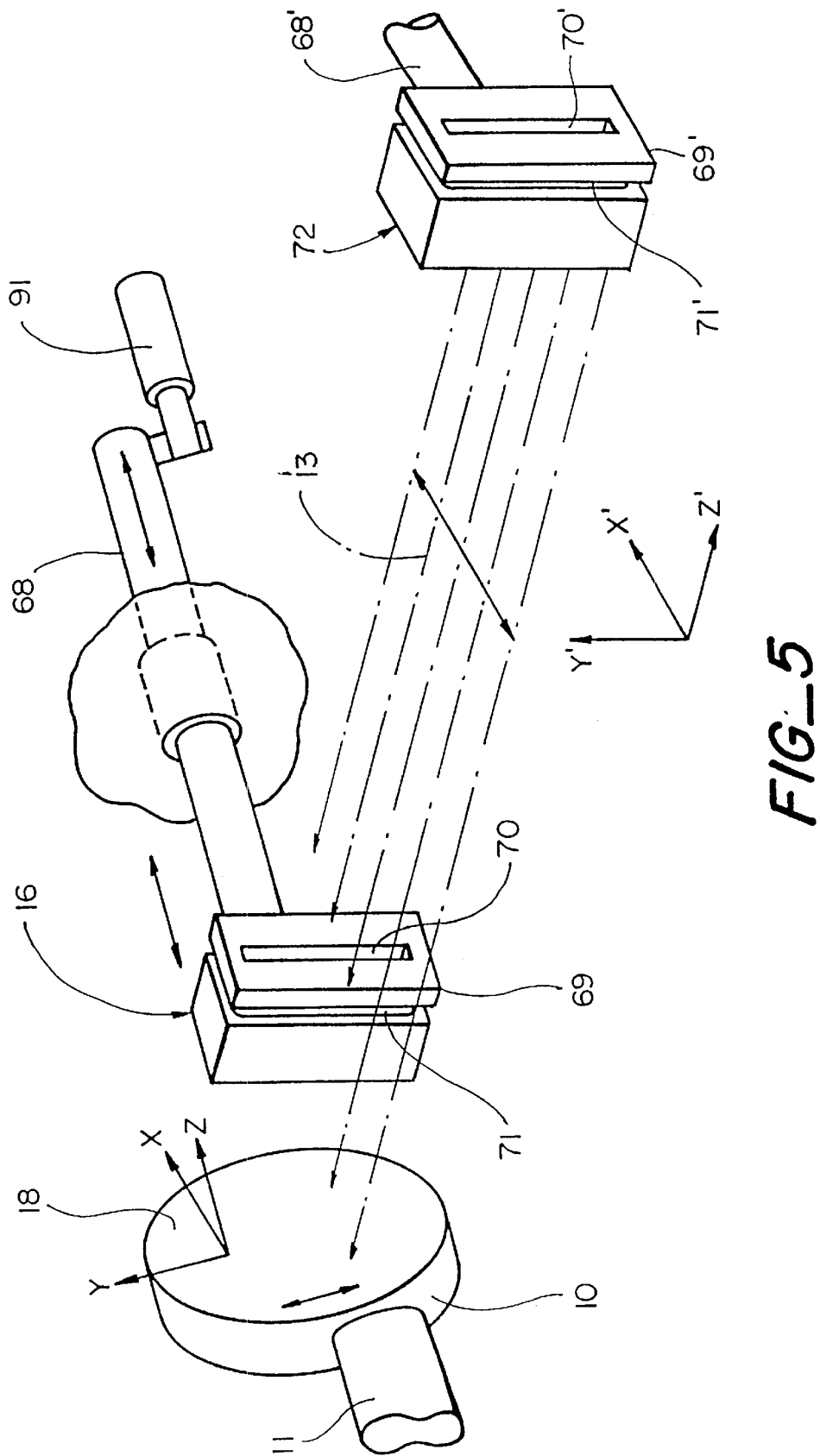
FIG_5

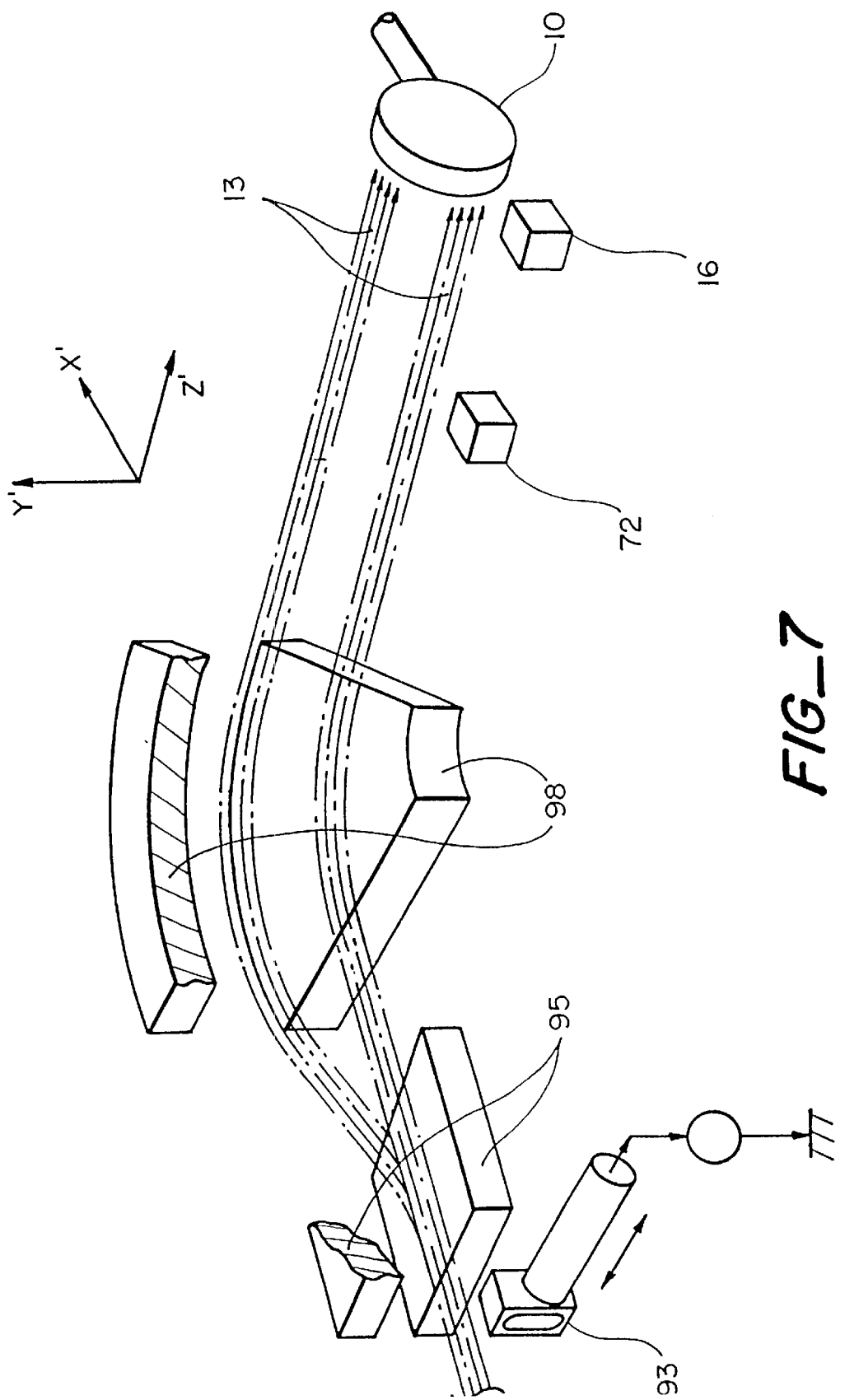
FIG_7

METHOD AND APPARATUS FOR CONTROLLING A WORKPIECE IN A VACUUM CHAMBER

This application is a Div. of 09/272,981 filed Mar. 19, 1999 now U.S. Pat. No. 6,163,033 which is a continuation of Ser. No. 08/926,650 filed Sep. 10, 1997 now U.S. Pat. No. 5,898,179.

FIELD OF THE INVENTION

The present invention relates to devices for providing individual workpieces such as silicon wafers or flat panel displays with a pre-selected orientation relative to a treatment beam.

BACKGROUND OF THE INVENTION

The manufacture of semiconductors during the front end stages includes a number of process steps whereby a silicon wafer is presented to an incoming ion beam, plasma, molecular beam, or other irradiating elements. In some cases, the irradiating element is scanned across the surface of the silicon wafer to provide a uniform spatial irradiation and the time spent determines the doping level. In others, the wafer is moved across a stationary beam of irradiating elements. High current ion implanters with purely mechanically scanned workpiece holders are examples of systems that scan the wafers through a stationary beam and provide on average uniform spatial doping. Doping uniformity is sero-controlled using the measured doping rate to vary the speed and duration of one mechanical axis while the other is controlled at a constant speed. Doping level is controlled by adjusting the number of completed scan passes in the servocontrolled direction such that the total dose is equally divisible by the number of scan passes. This technique is well known to those knowledgeable in the art and needs no further explanation.

The semiconductor industry is now migrating to 300 mm wafer diameters that cause the vacuum chambers and extent of mechanical motion to increase beyond practical limits for two direction mechanical scan systems. Furthermore, the cost of a single 300 mm wafer is currently very expensive which makes it desirable to process wafers individually rather than in batches because of the cost and wafer handling risks. Finally, the recent requirement of increasing the wafer tilt angles from the current 7 degrees to as much as 60 degrees precludes the use of mechanically scanned batch systems due to the variation in implant angle and twist across the wafer.

SUMMARY OF THE INVENTION

The present invention provides high angle tilt ion implants for silicon wafers with fast servo-controlled mechanical scanning in one direction and fast magnetic scanning in the orthogonal direction. Some of the features of this invention are:

(1) a differentially pumped integral air bearing vacuum seal for linear motion in the Y direction for the mechanical scan structure;

(2) a differentially pumped integral air bearing vacuum seal for rotary motion about the X-axis;

(3) air bearings for supporting the mechanical scan structure, centering and supporting the rotary seal, and centering and supporting the Y-scan linear seal; and (4) synchronous gating of the ion beam during transitions between implant states.

In other words, the ion beam is held off the wafer whenever a loss of beam is detected or other requirements dictate that the system go from an implant in progress to an implant hold state. This can occur while a flag Faraday is inserted into the beam path for set-up or tuning purposes.

For purposes of describing the geometry of the system, the mechanical scanning system uses Cartesian coordinates X, Y, and Z while the magnetic scanned beam uses Cartesian coordinates X', Y', and Z'. In all cases X and X' are identical. The ion beam is perpendicular to the X'Y' plane and is magnetically scanned in the X' direction.

In one aspect of the present invention, there are two movable bearing plates spaced from a fixed plate using gas bearings with an integral differentially pumped vacuum seal to prevent physical contact between seal surfaces on each of the plates. The combination gas bearing and vacuum seal for the outermost plate provides friction free movement in the Y direction. The combination gas bearing and vacuum seal for the inner plate provides friction free rotation about the X axis. The combination of the two moveable bearing plates provides tilting of a workpiece holder at any angle between 0 and 60 degrees for ion implanting in a silicon wafer and 90 degrees for horizontal wafer handling. This is accomplished by rotating the two moveable bearing plates about the X axis creating an angle between the Z & Z' and Y & Y' directions. The Z' direction is parallel with the incoming ion beam and Z is perpendicular to the surface of the workpiece holder. The tilting of the workpiece holder allows implants into the sides of deep trenches and gate structures located on the surface of the silicon wafer, a desirable feature for state of the art semiconductor manufacture. Horizontal wafer handling is a desirable feature in that it uses gravity to hold wafers while in motion obviating the need for edge clamping on the wafer that may result in damage to the wafer. Additional gas bearings center the rotating bearing plate about the X axis as well as prevent lateral motion of the outermost bearing plate along the Z direction.

In another aspect of the present invention, the ion beam intercepts each point on the surface of the workpiece (e.g., wafer) at the same distance along the Z' axis as the workpiece is reciprocated in the Y direction. This is accomplished using only three axes of controlled motion. If one assigns a unit vector to the wafer surface orientated with respect to the crystal lattice and another unit vector to the incoming ion beam, the relationship between these two vectors is constant as the wafer is reciprocated in front of the ion beam throughout the implantation process. Furthermore, the distance along the Z' axis to every point on the surface of the wafer as the wafer is reciprocated through the beam is the same such that each point on the wafer surface experiences exactly the same ion flux and trajectory. Thus enabling precise control over ion channeling through the crystal lattice during implantation leading to superior control over implant uniformity throughout the volume of the implanted surface.

In another aspect of the present invention, the magnetic scanner is used to hold the ion beam in the overscan region for a short duration while an upstream Faraday is inserted or retracted to prevent fine structure (i.e., non-uniformity) in the doping level across the wafer. To avoid non-uniformity in the doping, the ion beam is sampled when it is scanned off the edge of the wafer and both the magnetic and mechanical scanning controls are stopped if beam loss is detected. The implant is started in the same way, the beam is deflected off the wafer path before the Faraday is retracted and scanning starts precisely where it was interrupted. This method is also used to temporarily interrupt the implant for any reason deemed necessary, In another aspect of the present invention, there is provided an apparatus having a vacuum chamber having a chamber wall, a workpiece holder disposed within the vacuum chamber and extending through the chamber wall, a reciprocating member receiving the workpiece holder, and a rotating member interposed between the reciprocating member and the chamber wall.

In yet another aspect of the present invention, there is provided a method for ion implantation of a workpiece, including the steps of generating an ion beam perpendicular to a first XY plane, tilting the workpiece to a second XY plane relative to the first XY plane, scanning the ion beam across the workpiece along the X axis of the first XY plane and translating the workpiece along the Y axis of the second XY plane with all points on a face of the workpiece being equidistance from the source of the ion beam.

BRIEF DESCRIPTION OF THE DRAWINGS

FIG. 1 is a diagrammatic representation of an ion implantation device in accordance with the present invention.

FIGS. 2A–2D are detailed views of the translating and rotating seal assembly of the present invention.

FIGS. 3A–3C are detailed views of the rotating seal assembly.

FIG. 4 is a vacuum schematic.

FIG. 5 is a diagrammatic representation of a portion of the Faraday system in accordance with the present invention.

FIG. 6 is an illustration of the current integrator function.

FIG. 7 is a diagrammatic representation of the Faraday system in accordance with the present invention.

DETAILED DESCRIPTION OF THE PREFERRED EMBODIMENTS

The present invention can be used to mechanically scan 200 or 300 mm silicon wafers through an ion beam at speeds sufficient to reduce wafer heating and charging effects. It is important to note that although the present invention is described herein with respect to ion implantation, the present apparatus can also be used for other scanning operations, such as for the treatment of flat panels for flat panel displays. The ion beam is either fanned (i.e., a large rectangular cross section) or scanned (i.e., a small beam swept back and forth to form a large rectangular scanned area) at high speeds (e.g., in the range of about 150 Hz) in a direction (e.g., the X direction) orthogonal to that of the mechanical scan direction (e.g., the Y direction). The term "scanning" as used herein encompasses either magnetic or electrostatic fanning and magnetic or electrostatic scanning. The mechanical scanning (i.e., reciprocating) in the Y direction moves the wafer back and forth at high speeds (e.g., in the range of about 0.5 to 1 Hz) through the ion beam at a speed that is proportional to the measured beam current. In this way, the doping level per mechanical scan pass is controlled and the total dose is proportional to the dose per scan pass times the number of scan passes. In order to achieve mechanical scanning within the vacuum chamber 24 at high speeds with frictionless operation for long wear life and no particle generation, the present invention uses a novel combination of a linear motion bearing with differentially pumped vacuum seal (for friction-free movement in the Y direction) mounted on a rotary motion bearing with differentially pumped vacuum seal (for friction-free rotation about the X axis) on the exterior of the vacuum chamber 24. The linear motion bearing has a shaft 11 with a workpiece holder 10 at the distal end which extends through each of the vacuum seals into the vacuum chamber 24. The shaft 11 and workpiece holder 10 are translated in the Y direction by reciprocating the bearing and seal member or plate 12. The shaft 11 and workpiece holder 10 are tilted, along with bearing and seal member 12, by rotating the bearing and seal assembly 17.

The novel combination of a linear motion bearing and seal member with a workpiece holder and shaft attached thereto mounted on a rotary motion bearing and seal member provides isocentric scanning of the workpiece using the least number (i.e., three) of axes of motion possible. Isocentric scanning means that every intersection point of the ion beam with the surface of the workpiece is the same distance from the collimator magnet 98 exit boundary and the angular orientation of the ion beam and the angular orientation of the workpiece remain constant during the implant. The only three axes of motion required are (1) magnetically scanning the ion beam back and forth in the X' direction, (2) tilting the workpiece 18 and linear motion bearing and seal member 12 about the X axis, and (3) reciprocating the workpiece 18 and linear motion bearing and seal member 12 along the tilted Y axis, (i.e., reciprocating the workpiece 18 and linear motion bearing and seal plate 12 in the plane of the surface of the workpiece).

Referring to FIG. 1, the workpiece holder 10 is attached to a hollow shaft 11 connected to the linearly moveable bearing and seal member or plate 12. Bearing plate 12 reciprocates in the Y direction providing mechanical scanning of the workpiece (e.g., a silicon wafer) 18 through the parallel magnetically scanned ion beam 13. The ion beam 13 is directed along the Z' direction and magnetically scanned back and forth in the X' direction perpendicular to the X'Y' plane creating a parallel scanned ion beam 13. Hollow shaft 11 extends through bearing plate 12 and slot 32 (FIG. 3) in the raised portion 21 of wall of vacuum chamber 24 and rotating bearing assembly 17. Portion 21 is described herein as a raised portion of the vacuum chamber wall but it should be understood that the portion 21 need not be raised. Likewise, it should be understood that the portion 21 can be a fixed plate attached to the wall of the vacuum chamber.

The combination of the moveable bearing members 12 and 17 provides tilting of the workpiece holder 10 (see FIG. 5) at any angle between 0 and 60 degrees from vertical for ion implanting in a silicon wafer and between 0 and 90 degrees for wafer handling. Tilting is accomplished by rotating the moveable bearing members 12 and 17 about the X axis creating an angle between the Z & Z' and Y & Y' axes. The Z' direction is defined as being parallel with the incoming ion beam and Z is defined as being perpendicular to the surface of the workpiece holder 10. The tilting of the workpiece holder 10 allows implants into the sides of deep trenches and gate structures located on the surface of the silicon wafer. Horizontal wafer handling (i.e., tilting the workpiece holder 90 degrees from vertical) in accordance with the present invention uses gravity to hold the wafer on the workpiece holder while in motion obviating the need for edge clamping on the wafer that may result in damage to the wafer. Gas bearings 28 (FIG. 2B) on the exterior of vacuum chamber wall 21 center the rotating bearing and seal assembly 17 about the X axis. Gas bearings 30 mounted on rectangular bearing plate 19 prevent lateral motion of the bearing member 12 along the Z direction.

The bearing member or plate 12 (FIG. 1) is connected to a drive motor 14 controlled by a computer 15. The computer 15 in combination with a current integrator 73 monitors the ion flux arriving in a downstream Faraday 16. The velocity in the Y direction imparted to the bearing plate 12 by the motor 14 is varied in proportion to the ion flux measured by the control computer 15 so as to create uniform average flux density across the surface of the workpiece 18. With the laterally moveable bearing plate 12 connected to the rotating bearing member or assembly 17 by support arm 97 the intercept of the ion beam 13 with the workpiece 18 is maintained at a constant distance along the Z' axis as the workpiece 18 is translated back and forth through the ion beam 13 by the linear drive motor 14. The rotary motion of the rotating bearing assembly 17 is provided by a linear drive motor (not shown) and associated linkage (not shown) as known in the art.

Rotation of the bearing assembly 17 by 90 degrees from vertical about the X axis when the bearing plate 12 is in its uppermost position allows horizontal handling of the workpiece 18 during wafer load and unload from the wafer handler 99. The surface of the workpiece holder 10 may be rotated about its Z axis to any rotation angle between 0 and 360 degrees through a drive system (not shown) connected through the hollow shaft 11. This permits wafer flat or notch orientation prior to implantation and may be done while the workpiece holder 10 is in motion from the load position to the implant position eliminating time normally wasted for wafer flat orientation. The present invention uses a video camera and processing software for the purpose of locating the position and orientation of each wafer relative to the load/unload robot 99 and workpiece holder 10 while the handler is in motion. This allows precise loading of the wafer onto the workpiece holder 10 as well as correct flat or notch orientation. This video image may also be used to capture the part code or number scribed onto the wafer surface for material tracking purposes. Rotation about the Z axis of the surface of the workpiece holder is also an enabling function for implants into the sides of deep trenches and gate structures.

Referring to FIGS. 2A–3C, the details of the linear reciprocating bearing and seal plate 12 and the rotating bearing and seal assembly 17 are shown. Rotating bearing and seal assembly 17 is made up of bearing and seal plate 19 and a circular bearing and seal plate 20 attached on opposite sides of a center plate 31. The gas bearings will be described first. Bearing and seal plate 20 of seal assembly 17 is separated from wall portion 21 by a gas bearing formed by an array of gas nozzles 25 (FIG. 3C) located on the surface 59 of the bearing plate 20. A high pressure gas manifold 58 (FIG. 2D) is connected to each of the gas nozzles 25 to provide a steady supply of gas for the gas bearing. The pressure over surface 59 between the outer and inner gas nozzles 25 is maintained at a constant pressure by flow restrictors in the nozzles 25 and the spacing between the seal and bearing plate 20 and the wall portion 21. The wall portion 21, which is a circular seal plate, is fixed in position relative to the overall vacuum chamber 24. Wall portion 21 contains a set of air bearings 28 (FIG. 2B) that center the rotating seal assembly 17 about the center of the fixed seal plate 21 by applying a gas force directed in the radial direction against the side of the center plate 31. Bearing and seal plate 19 of seal assembly 17 is separated from bearing and seal plate 12 by a gas bearing formed by an array of gas nozzles 26 (FIGS. 2B and 3A) located on the surface 90 of the bearing plate 19. A high pressure gas manifold (not shown) supplies a steady supply of gas for the gas bearing. The pressure over surface 90 between the outer and inner gas nozzles 26 is maintained at a constant pressure by flow restrictors in the nozzles 26 and the spacing between the seal and bearing plate 19 and the seal and bearing plate 12. A set of gas bearings 30 attached to the bearing plate 19 prevent movement of the seal plate 12 in the Z direction by applying a gas force to the opposite sides of the seal plate 12.

Having described the gas bearings, the vacuum seals will now be described. Pumping grooves 37, 40 and 41 (FIGS. 3B and 3C) in the surface of the bearing and seal plate 20 form a differentially pumped vacuum seal between bearing and seal plate 20 and wall portion 21 of the vacuum chamber 24. Pumping grooves 33, 38 and 39 (FIGS. 3A and 3B) in the surface of the bearing and seal plate 19 form a differentially pumped vacuum seal between bearing and seal plate 19 and bearing and seal plate 12. Grooves 33, 38 and 39 have an oval shape to accommodate the rectangular shape of the reciprocating seal plate 12. The bearings and seals are non-contact with respect to each other and the reciprocating shaft 11 thus providing a friction-free, non-particle generating, high speed rotation and linear motion vacuum feed-through.

The balance of force on each of the elements of the vacuum seal assembly is as follows. Atmospheric pressure working against the vacuum inside the vacuum chamber 24 applies an external force which balanced against the air cushion created by the gas being between the bearing and seal plate 12 and the bearing and seal plate 19 creates a slight separation between the plate 12 and plate 19 while preventing movement in the X direction of the seal plate 12. The set of air bearings 30 located on opposite sides of the seal plate 12 and attached to the rotating seal assembly 17 apply equal forces in the positive Z and negative Z directions preventing contact and relative Z motion between the seal plate 12 and the bearing plate 19. In this way seal plate 12 is prevented from moving in either the X or Z direction but allowed frictionless translation in the Y direction. Atmospheric pressure working against the vacuum inside the vacuum chamber 24 also applies an external force which balanced against the air cushion created by the gas bearing between the bearing and seal plate 20 and the wall portion 21 creates a slight separation between the plate 20 and wall portion 21 while preventing contact and relative X motion between the wall portion 21 and the bearing and seal plate 20. The set of air bearings 28 attached to the wall portion 21 apply a uniform radial force against the center plate 31 preventing contact and relative radial motion between the seal assembly 17 and the wall portion plate 21. The wall portion 21, which is a seal plate, is attached to the vacuum chamber 24 fixing the position of the seal plate 21 which in turn fixes the position of the seal assembly 17 which in turn fixes the position of the seal plate 12 relative to the vacuum chamber 24. The rotating seal assembly 17 is constrained in X, Y and Z but allowed frictionless rotary motion about the X axis. The pressure inside the air bearing regions 59 and 90 is self-regulated to some fraction of the pressure inside the high pressure manifold. This self-regulation occurs because the gap between the bearing and seal plates is constrained only by the atmospheric pressure applied to the outside of the seal plates, thereby controlling the leak rate of air out of the bearing regions. By adjusting the pressure in the high pressure manifold, one can vary the gap between the seal and bearing plates. The gap between the seal and bearing plates is, preferably, 0.001 inches or less.

Since the gas bearing gap is very small, the gas flow rates required to produce the gas bearing are also very small (e.g., 1 to 4 cubic feet per minute). For proper spacing, the opposing seal and bearing plate surfaces must be very flat across their entire width. A technique known as "lapping" performed by Form Centerless Co. in St. Medfield, Mass. can be used to achieve the desired flatness which should be within 0.0003 inches of true flatness. To prevent damage to the seal and bearing plate surfaces if they were to come into contact, an anodized surface such as polytetrafluoroethylene-penetrated hardcoat anodizing for aluminum alloys sold under the tradename NITUFF available from Nimet Industries, Inc. in South-Bend, Ind., nickel, or hard chrome can be applied to the surface of the seal surfaces and bearing plate.

Referring now to FIGS. 3 and 4, the differentially pumped vacuum seal system will now be described. An oval slot 32 extends through the plates 19, 20, and 31 in direct communication with the high vacuum region of the vacuum chamber 24. The slot 32 allows non-contact full translation of the workpiece holder 10 and shaft 11 in the Y direction. Adjacent to slot 32 is the oval pumping groove 33 (FIG. 3A) in the surface of the plate 19. Ports 36 extending through the center plate 31 connect groove 33 to circular groove 37 in the surface of the bearing plate 20. Oval grooves 38 and 39 are connected to circular grooves 40 and 41 through ports 42 and 43, respectively. Each pair of oval and circular grooves are connected through ports (not shown) to the differential pumping vacuum system shown in FIG. 4 as follows. Grooves 33 and 37 and ports 36 are connected to the third stage 34 of the differential pumping system and nearly isolated from the high vacuum region 52 and the second stage 53 of the differential pumping system by the seal surfaces 29 and 35 and 46 and 49, respectively. Grooves 38 and 40 and ports 42 are connected to second stage 53 of the differential pumping system and nearly isolated from the third stage 34 and the first stage 54 of the differential pumping system by the seal surfaces 46 and 49 and 47 and 50, respectively. Grooves 39 and 40 and ports 43 are connected to the first stage 54 of the differential pumping system and nearly isolated from the second stage 53 of the differential pumping system and atmosphere 55 by the seal surfaces 47 and 50 and 48 and 51, respectively. Grooves 56 and 57 in seal plates 19 and 20, respectively, located at a greater diameter than the other grooves are ported to the atmosphere side of the vacuum seal assembly to exhaust the air that escapes the inside perimeter of the air bearing assembly. Each set of grooves are described as "nearly" isolated because there is some movement of gas over the seal surfaces toward the vacuum region.

Referring now to FIG. 4, the vacuum schematic illustrates the differential pumping system which includes a high vacuum cryo-pump 60 to create a vacuum in the vicinity of the workpiece 18, a turbomolecular mechanical pump 61 to maintain the pressure in the third stage differential pumping region 34, a second turbomolecular pump 62 connected to the exhaust port 65 of the first turbomolecular pump 61 and to the second stage differential pumping region 53, a dry mechanical pump 63 connected to the exhaust port 66 of the second turbomolecular pump and to the first stage differential pumping region 54 with its outlet exhausted to atmosphere 55. The pressure in each of the successive differential pumping stages 54, 53 and 34, drops by roughly an order of magnitude from atmosphere at 55 to less than a millibar in the third stage 34. The conductance between the third stage 34 and the high vacuum region 52 is several orders of magnitude lower than the pumping speed of the high vacuum pump 60 reducing the pressure in the vicinity of the workpiece 18 to a level near the base pressure of the high vacuum pump 60.

As bearing and seal member 12 reciprocates along the Y axis, the two outermost ends 92 and 94 (FIGS. 1 and 2B) are extended beyond the ends of the seal plate 19 thus exposing the ends 92 and 94 to the atmosphere where the ends pick up moisture. As the end exposed to the atmosphere is translated to a position where it is exposed to the vacuum seal grooves, moisture from the seal member 12 is drawn into the vacuum region creating a load causing the vacuum pumps to work harder. Therefore, in a preferred embodiment, a dry gas (e.g., nitrogen) blanket is applied using a shield or bag to each of the ends 92 and 94 as they travel past the ends of the seal plate 19 to prevent them from picking up moisture.

As conventionally known in the prior art, the workpiece holder 10 has an electrostatic chuck for holding silicon wafers onto a ceramic coated platen surface, a plurality of gas cooling ports to feed gas to the region between the back of the wafer and the surface of the platen, a plurality of water cooling passages to cool the backside of the electrostatic chuck, a rotary bearing, a differentially pumped rotary shaft seal assembly, a plurality of wafer lifting pins, and a drive assembly used to rotate the surface of the workpiece holder 0 to 360 degrees about an axis perpendicular to the workpiece.

Magnetic scanning is conducted with the present invention such that the ion beam trajectory is maintained perpendicular to the X' Y' plane at all times. As described previously, two magnetic deflection systems 95 and 98 (FIG. 7) located one after the other along the beam flight path are used. Referring to FIGS. 5 and 7, the implantation control system will be described. A Faraday assembly 16 is mounted to a linear actuator 68 that provides motion of the Faraday 16 along the X' direction. The Faraday 16 is fitted with an aperture plate 69 positioned with its surface in the X'Y' plane. A thin slit aperture 70 is located through the aperture plate 69 with its long dimension oriented in the Y' direction. The Faraday 16 is moved by the linear actuator 68 such that the slit 70 may be positioned anywhere within the transverse range of the scanned beam 13 along the X' direction. The aperture plate 69 and its slit 70 are longer in the Y' direction than the Y' height of the beam 13. This allows for the beam 13 to be scanned across the surface of the aperture plate 69 admitting a fraction of the beam current into the Faraday cup 71 located behind the plate 69. The current-time profile of the Faraday signal may be transformed into a one-dimensional beam intensity-position profile using suitable arithmetic in a computer controlled measurement system as known by those of ordinary skill in the art. This enables correlation between magnetic scan amplitude and beam position in the X' direction.

In a preferred embodiment, there are two movable Faraday assemblies 16 and 72. Downstream Faraday 16 is located in the beam scanning plane next to the workpiece holder 10 and the Faraday 72 is located upstream. Both Faraday assemblies have the same freedom of motion allowing identical measurements of the ion beam 13 both upstream and downstream inside the vacuum chamber 24. The downstream Faraday 16 serves the dual purposes of beam setup and measuring and controlling implant dose. The upstream and dow am Faradays 16 and 72 are used to measure beam parallelism. Each of these Faradays is positioned in the beam path 13 at identical X' positions but with different Z' positions. Since the magnetic scan waveform (amplitude versus time) is repetitive, the amplitude versus beam position can be expressed in terms of the phase angle of the repeated wave form. The phase angle difference between measurements of beam position in the two Faradays 16 and 72 is used to calculate the deviation from parallel for the scanned rays of the ion beam 13. These phase angle measurements are made when the workpiece holder 10 is moved out of the beam path.

The Faraday cup 72 is electrically connected to the vacuum chamber 24 through an electrometer circuit (not shown) to measure the total ion beam charge entering the Faraday cup 96 through slit 70' in plate 69'. For each positive ion entering the field of the Faraday cup 72, a negative charge is induced on the surface of the cup. These charges combine to maintain net neutrality. The flow of negative charge into the cup from the electrometer is a measure of ion beam flux entering the cup. When the ion beam consists of singlely charged ions, the number of negative charges equals the number of positive ions entering the Faraday cup 72 through the slit 70'.

In another aspect of the present invention, the magnetic scanner is used to hold the ion beam 13 in an overscan region off of the workpiece holder 10 for a short 13 duration while the flag Faraday 93 is inserted or retracted from in front of the ion beam to prevent fine structure (i.e., non-uniformity) in the doping level across the workpiece. To avoid non-uniformity in the doping, the ion beam 13 is sampled when it is scanned off the edge of the wafer with the present invention and both the magnetic and mechanical scanning controls are stopped if beam loss is detected. The magnetic scanner is capable of holding the ion beam off the edge of the wafer for approximately 200 milliseconds providing ample time to insert the flag Faraday 93 into the ion beam path. This method is also used to temporarily interrupt the implant for any reason deemed necessary. The implant state is started in a similar manner, the ion beam 13 is turned on before the flag Faraday 93 is retracted and scanning starts precisely where it was interrupted.

In other words, the ion beam is held off the wafer whenever a loss of beam is detected or other requirements dictate that the system go from an implant in progress to an implant hold state. This occurs within a few tens of milliseconds while a flag Faraday 93 is inserted into the beam path for set-up or tuning purposes. The process of starting an implant occurs in a similar way. First the scanning magnet is set to deflect the beam off of the wafer path while the flag Faraday 93 is retracted. Then, the scanning starts with the beam off the wafer to prevent structure (i.e., non-uniformity) in the doping of the implanted wafer.

The ion beam 13 is scanned at a constant velocity $V_x$ across both the Faraday cup 71 and the workpiece 18 such that the ion beam 13 moves completely off the workpiece 18 and past the slit 70 during ion implantation steps. The one dimensional dose D, is measured by integrating the flux of charge entering the Faraday cup 71. This one dimensional dose $D_x$ is simply the integral of the charge flux and is measured by the scan control computer 15. The mechanical scan velocity $V_y$ of the workpiece holder 10 in the Y direction is controlled by the scan control computer 15 in proportion to the one dimensional dose $D_x$ measured during each back and forth pass of the ion beam 13 across the Faraday cup 71 and workpiece 18. The dose $D_x$ multiplied by a constant K determines the total dose per unit area that the workpiece 18 receives in a single back and forth pass of the workpiece 18 through the scanned ion beam 13. The total dose per unit area received by the workpiece in a complete implant cycle is determined by the single pass dose times the number of passes N. Both the number of passes N and the constant K are predetermined such that after N passes the desired dose is received by the workpiece 18.

During beam setup, the workpiece holder 10 is moved in the Y direction to a location clear of the Faraday 16 to allow for X' motion of the Faraday 16 for purposes of measuring beam parallelism and scan uniformity. FIG. 6 illustrates the amplitude time wave form of the current integrator 73 (FIG. 1) associated with the scan control computer 15. The wave form results from the ion beam 13 being scanned across the Faraday slit 70. The current integrator 73 consists of a current-to-voltage converter section followed by an integrator section. The output wave form 74 of the current-to-voltage converter section is integrated to produce the integral wave form 75. The flat regions 76 and 78 of the integrator output represent the periods when no part of the ion beam 13 is entering the Faraday cup 71. The rising region 79 of the integrator output represents the period when the ion beam 13 passes over the Faraday slit 70 allowing a portion of the ion beam to enter the Faraday cup 71. The sharp negative slope 80 of the wave form 75 represents the integrator-reset function. A fast sampling A/D converter (not shown) is used to measure the amplitude of the integrator output during the periods 76, 79 and 78 to determine instrument offset, dark or stray current, and beam current reproduced by the current-to-voltage converter. Offset and dark current are determined by the slope of the amplitude during periods 76 and 78. Beam current is measured during the period 79. The slope of periods 76 and 78 are multiplied by the total integrator period 81 and then subtracted from the difference between the starting sample 82 and ending sample 83 to arrive at a corrected integral measurement. The time of the one-half height measurement 84 corresponds to the time when the beam is centered over the Faraday slit 70 which precisely defines the beam position in the X' direction. Each of the Faradays 16 and 72 are stepped across the X' positions and measure the beam arrival times 84 relative to the turn around points in the magnetic scan space X'. Although 20 the Faradays 16 and 72 cover the same X' positions, they occupy separate but parallel X'Y' planes during these measurement steps.

A pulse integrator (not shown) in combination with a sampling A/D converter (not shown) and the small movable Faraday cups 16 and 72 measure beam profiles, magnetic scan linearity, beam parallelism, dose rate, and instrumentation offset. This information is used in combination to compensate for offset or dark current, scan non-linearity, variations in beam current versus X' position, and beam parallelism during set-up and during implant operations. The magnetic scan profile of magnet current versus time may be modified to produce a one-dimensional uniform doping profile across the target plane in the X' direction. The method of measuring dark current (which is all unwanted constant currents including instrumentation offset) is accomplished by sampling the slope of the integrator output as the beam passes across the Faraday aperture, including a period before and a period after its passage. The pulse integrator is enabled for a precisely fixed period of time and produces an analog output that is the time integral of the beam current pulse and any stray current not related to the ion beam. The stray current may include instrument offset current, leakage current in the Faraday, electron current from wafer charged neutralizers, ion current from the background plasma surrounding the ion beam, or any other source of constant current summed together and included in the integral measurement. The characteristic wave form of the integrator output, when sampling a pulse or current with no contributing offsets has two periods of time one before and one after passage of the pulse when the slope of the integrator output versus time is zero. When an offset current is simultaneously summed with the true beam current pulse, the slope before and after the passage of the beam pulse is constant and is easily measured using a fast sampling A/D convertor. Since the slope is constant and measurable, the product of the slope and the integrator time period can easily be subtracted from the integral measurement to arrive at the true integrated beam current pulse.

The method of measuring beam parallelism and scan uniformity utilizes the two separate Faradays 16 and 72 in combination with the integrator 73 to measure the X' position of the ion beam in two parallel X'Y' planes. Each Faraday 16 and 72 is positioned using a stepper motor drive 91 in combination with a linear drive mechanism 68 and 68' to provide accurate and repeatable X' position in small discrete 0.001 inch steps (FIG. 5). Faraday 16 is positioned such that its slit 70 is located in the implant plane while the Faraday 72 is positioned upstream. The width of the beam 13 is larger than the slit width, however, this is of no consequence since the integrator output yields the total integrated current once the beam passes over the slits 70 and 70'. This integrated current is the one dimensional dose $D_x$ at the X' position of each of the Faradays. Varying the X' position of each of the Faradays enables measurement of $D_x$ at discrete locations across the magnetic scan space. The output wave form, after it has been corrected for offset or dark current will have three pieces of information critical for this control algorithm. The ending amplitude of the integrator output less the beginning amplitude is the integral of the beam current. The time at which the half amplitude of the integrator output is reached corresponds to the time when the beam center is coincident with the center of the Faraday slit. These two measurements, $D_x$ and X'(t), provide the basis for calibrating parallelism and scan or dose uniformity of the system. Since the magnetic scan wave form is repetitive, the ion beam retraces the same space across the X' direction in a continuous manner with each successive magnetic scan pass. It follows that by positioning a Faraday at discrete locations in the X' scan space one can measure X' and $D_x$ at each of these locations. Assigning $X'_i$ and $X'_j$ to locations corresponding to the upstream and downstream Faradays 16 and 72, respectively, with the i and j positions being identical in X' but not Z', then the angular deviation in the ion beam trajectory from the Z' direction is the arc-tangent of $\Delta x/\Delta z$. Where $\Delta x$ is equal to $X'_i$ minus $X'_j$. The collimator magnet 98 is adjusted under software control to assure a minimum angular variation across the scan space.

The next step is to calibrate the scanner magnet 95. It is a requirement for uniform dose control in the implant plane that the discrete values of $D_{xj}$ be equal. The scan velocity $V_x$ must be constant to achieve a uniform dose when the beam current is constant. The scanner 95 is simply calibrated by measuring values of $X_j$ versus $B_j$ and finding a scan wave form that satisfies the requirement for constant scan velocity. Once the wave form is defined that produces a constant velocity $V_x$, the doses checked, $D_x$ against X is measured and variations are used to recalculate a function to modify the scan velocity. The final result is a polynomial in time T that defines the magnetic scan wave form that includes corrections for beam intensity variation as well as non-linearity in the scanner magnet 95.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of implanting ions in a workpiece comprising:
   generating an ion beam perpendicular to a first plane, $X^1Y^1$;
   holding the workpiece in a second plane, XY, in which the X-axis remains aligned with the $X^1$ axis of the first plane;
   scanning the ion beam across the workpiece along the $X^1$-axis of the first plane;
   translating the workpiece in a direction orthogonal to the $X^1$-axis so that the ion beam impinges on all parts of the workpiece; and
   holding the ion beam off the workpiece, deflected in the $X^1$-direction, when interrupting or resuming an implant.

2. A method as claimed in claim 1, wherein an implant is interrupted by inserting a flag Faraday into the ion beam path, when the ion beam is being held off the workpiece.

3. A method as claimed in claim 1, wherein an implant is resumed by removing a flag Faraday from the ion beam path when the ion beam scanner is controlled to hold the ion beam off the workpiece; and resuming scanning of the ion beam.

4. A method as claimed in claim 1, wherein the workpiece is translated in the Y-direction.

5. A method as claimed in claim 1, wherein the ion beam is sampled when it is scanned off the edge of the workpiece and both the beam scanning and the workpiece translation are stopped if beam loss is detected.

6. An ion implanter comprising:
   a vacuum chamber having a chamber wall,
   a workpiece holder,
   a reciprocatable member carrying the workpiece holder;
   a rotatable member carrying the reciprocatable member on the chamber wall;
   an ion beam source;
   an ion beam scanner which scans the ion beam in a first direction across a workpiece on the workpiece holder; and
   first and second Faradays located upstream and downstream respectively along the scanned beam path for measuring the parallelism of the scanned beam.

7. An ion implanter comprising:
   a vacuum chamber having a chamber wall;
   a workpiece holder;
   a reciprocatable member carrying the workpiece holder;
   a rotatable member carrying the reciprocatable member on the chamber wall;
   an ion beam source;
   an ion beam scanner which scans the ion beam in a first direction ($X^1$) across a workpiece on the workpiece holder in accordance with a scan waveform; and
   a movable Faraday to measure the integrated beam current at various positions in the $X^1$ direction, said ion beam scanner being arranged to modify the scan waveform to correct for beam intensity variations.

* * * * *